United States Patent [19]
Zasio

[11] 4,420,691
[45] Dec. 13, 1983

[54] METHOD OF ALIGNING ELECTRON BEAM APPARATUS

[75] Inventor: John J. Zasio, Sunnyvale, Calif.

[73] Assignee: Fujitsu Limited, Kawasaki, Japan

[21] Appl. No.: 973,909

[22] Filed: Dec. 28, 1978

[51] Int. Cl.³ ..................... G01M 21/00; A61K 27/02
[52] U.S. Cl. ............................ 250/491.1; 250/492.1; 250/492.2
[58] Field of Search ............... 250/491, 492 A, 492 B, 250/492.1, 492.2

[56] References Cited

U.S. PATENT DOCUMENTS 3,519,788 7/1970 Hatzakis .......................... 250/492 A
3,644,700 2/1972 Kruppa ........................... 250/492 A

OTHER PUBLICATIONS

"Automatic Pattern Positioning . . ." by Miyauchi et al. IEEE Transactions on Electron Devices vol. 17, No. 6 Jun. 1970 pp. 450–457.

Primary Examiner—Harold Dixon
Attorney, Agent, or Firm—Flehr, Hohbach, Test, Albritton & Herbert

[57] ABSTRACT

Electron beam apparatus is used to develop a resist coated work piece such as a semiconductor wafer which is mounted on a moveable XY table within the apparatus work chamber. A work piece holder includes an alignment device for aligning the electron beam for highly accurate beam scanning. Thereafter, the electron beam axes are correlated to the work piece axes. In correlating the axes, the electron beam is rotated whereby the beam X and Y axes are parallel to the work piece X and Y axes, respectively. The work piece axes are then correlated to the axes of the XY table by locating the table coordinates of two known positions on the wafer.

6 Claims, 6 Drawing Figures

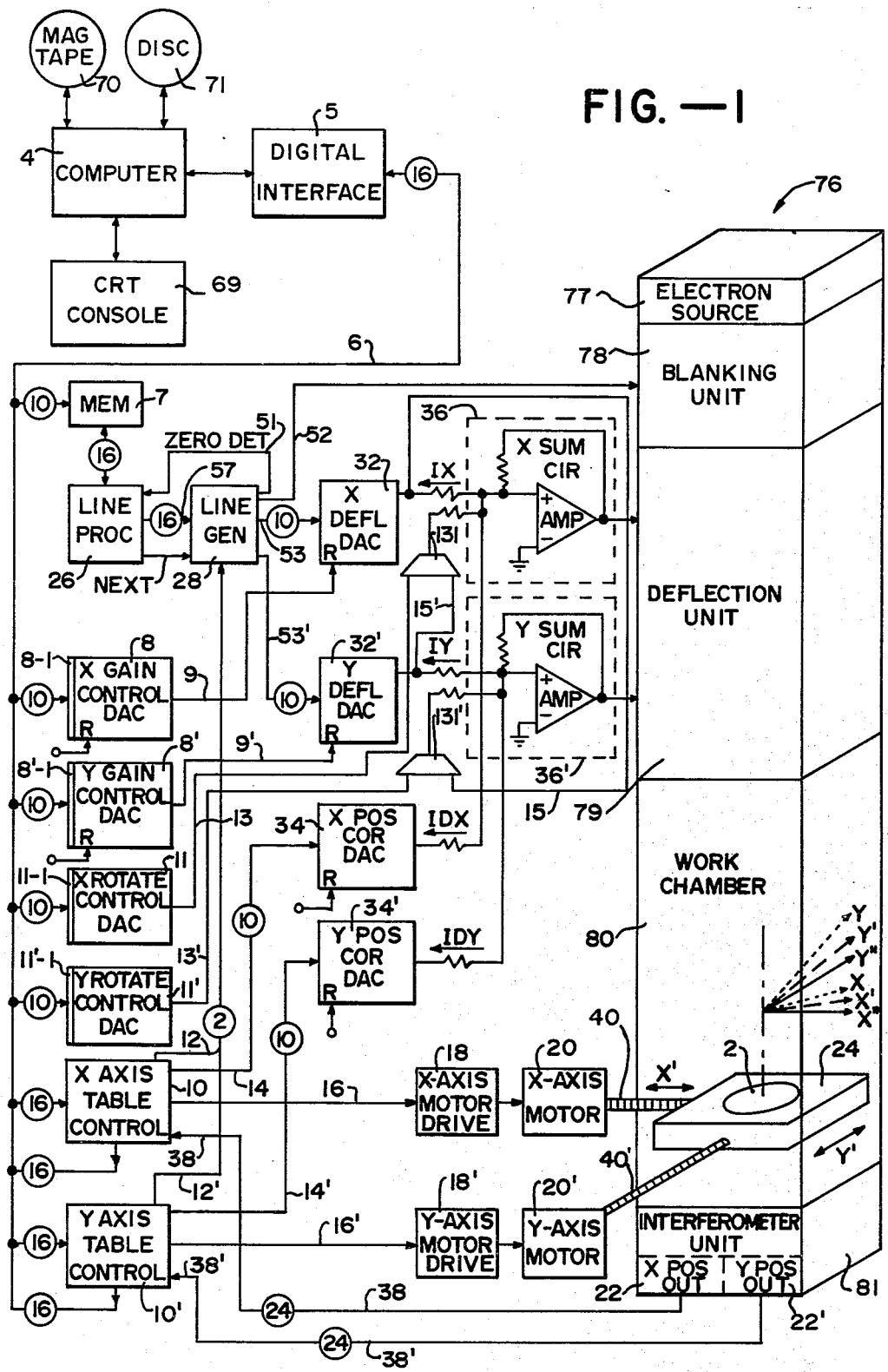
FIG.—1

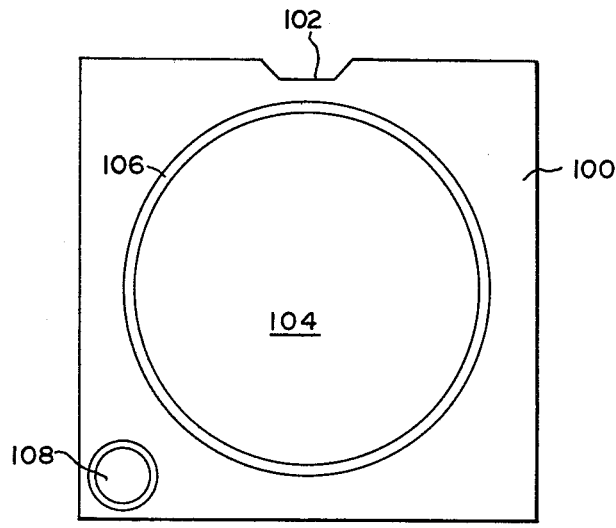
FIG.—2
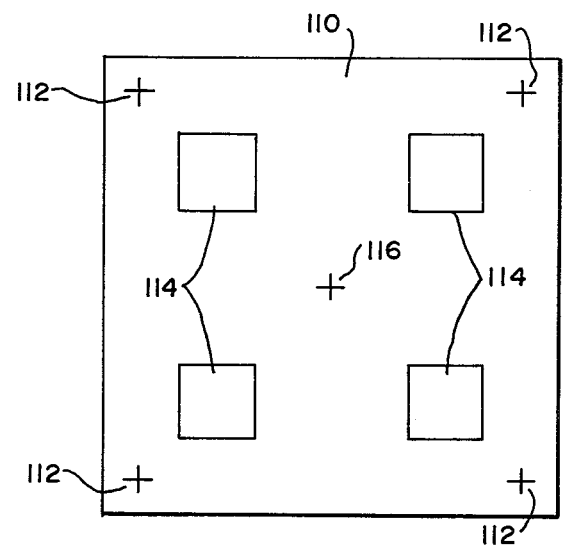
FIG.—3
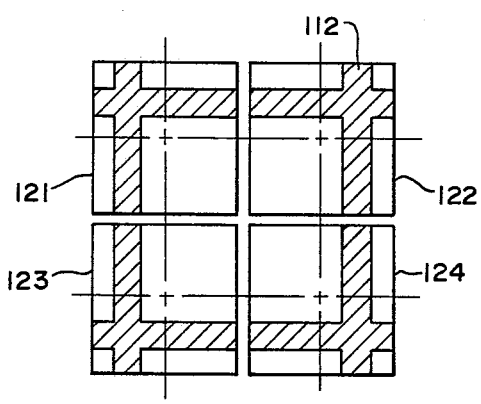
FIG.—4
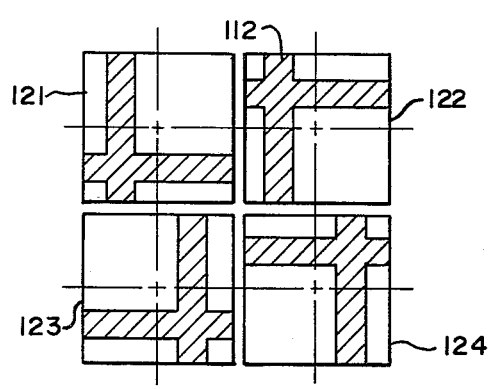
FIG.—5

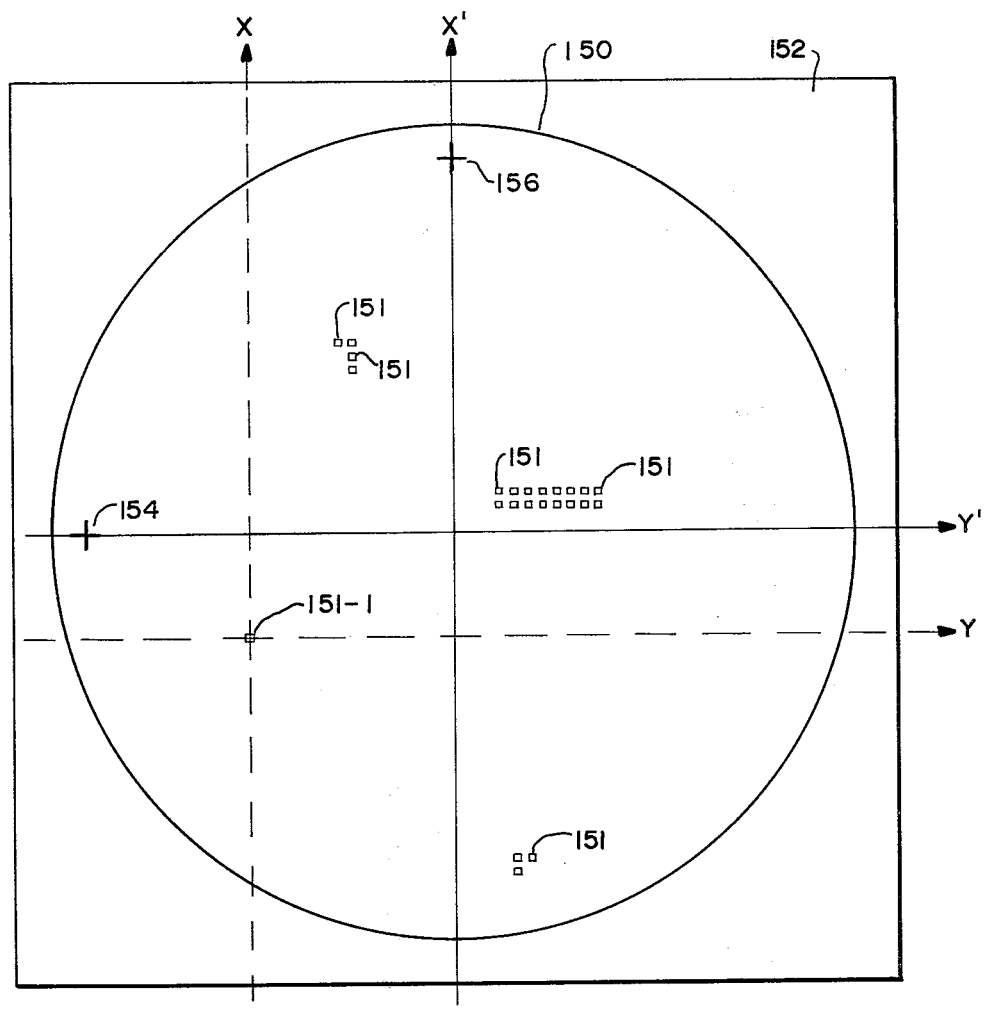
FIG.—6

METHOD OF ALIGNING ELECTRON BEAM APPARATUS

BACKGROUND OF THE INVENTION

This invention relates generally to electron beam apparatus as used in the fabrication of semiconductor integrated circuits and like microminiature devices, and more particularly the invention relates to a method of aligning electron beam equipment.

It has long been known that the high resolution and excellent depth of focusing capabilities of an electron beam make it a practical tool for inclusion in an automated system for manufacturing microminiature electronic devices. The electron beam is controlled in a highly accurate and high speed manner to expose an electron-resist-coated material as a step in the fabrication of extremely small and precise low cost integrated circuits.

Although an electron beam can be deflected and blanked in a high speed manner, the area over which the beam is capable of being deflected is relatively small. A basic problem presented, therefore, is accommodating this small area scan field in the rapid and efficient exposure of relatively large resist coated areas as is desirable with increasingly larger semiconductor wafers. In addition to larger areas to be exposed, increased densities of circuit elements are desired in semiconductor integrated circuits. A trend in the industry has been a greater number of circuits per unit of area and a tendency towards smaller and smaller circuits. In this manner, it becomes increasingly possible to integrate an entire subsystem or system on a relatively few number of semiconductor chips.

In copending application Ser. No. 847,485, filed Nov. 1, 1977, for "Electron Beam Exposure System Method and Apparatus" now U.S. Pat. No. 4,147,937 issued Apr. 3, 1979, an electron beam exposure system is disclosed. An electron beam column including electron source, blanking unit, deflection unit, and work chamber is provided along with an X-Y table and attendant controls for the electron beam column and table. The electron beam is accurately deflectible along X-Y axes over a small area (e.g. 512 microns square). Since the semiconductor wafer is much larger, the wafer and X-Y table on which the wafer is mounted must be repositioned many times for the wafer to be fully exposed to the electron beam. Moreover, the semiconductor substrate will be taken from and returned to the electron beam apparatus several times during the fabrication process for different electron beam mask definition patterns.

Thus, the need exists for accurately aligning and realigning the electron beam, work piece, and X-Y table during fabrication of a microminiature device using electron beam defined manufacturing masks.

SUMMARY OF THE INVENTION

An object of this invention is a method of aligning electron beam apparatus.

Another object of the invention is an improved method of aligning an electron beam and exposing a work piece to the electron beam.

Another object of the invention is a method of correlating the axes of an electron beam to the axes of a work piece mounted on a moveable X-Y table.

Briefly, in accordance with the invention a work piece and holder is positioned on an X-Y table within the work chamber of electron beam apparatus. The electron beam is aligned with respect to a defined pattern on an alignment device on the work piece holder. The electron beam is then aligned with respect to the axes of a work piece mounted on the holder with the X and Y axes of the beam rotated to be parallel with the X and Y axes of the work piece, respectively. Thereafter, the table axes are aligned with the work piece whereupon computer control of the electron beam and of the X-Y table is coordinated with respect to the work piece mounted on the table.

Upon removal of a work piece and subsequent remounting of the work piece on the table for further processing, the electron beam is again aligned with respect to the work piece axes, and then the table axes are aligned with the work piece. Realignment of the electron beam is usually necessary only if the resist material is altered whereby a different electron voltage is necessary in the development thereof.

The invention and objects and features thereof will be more readily apparent from the following detailed description and appended claims when taken with the drawings.

BRIEF DESCRIPTION OF THE DRAWINGS

FIG. 1 illustrates an overall electrical schematic block diagram of an electron beam apparatus in which the present invention is useful.

FIG. 2 is a plan view of a work piece holder and alignment device useful in practicing the present invention.

FIG. 3 is an enlarged plan view of one alignment device in FIG. 2.

FIG. 4 illustrates a magnification error in aligning an electron beam.

FIG. 5 illustrates a rotational error in aligning an electron beam.

FIG. 6 is an enlarged plan view of a semiconductor wafer with the axes of an electron beam, the wafer, and an XY table superimposed thereon.

DETAILED DESCRIPTION

Overall System

FIG. 1 illustrates an overall electrical schematic block diagram of an electron beam apparatus in which the present invention is useful. The apparatus is described in detail in copending application Ser. No. 847,485, supra, now U.S. Pat. No. 4,147,937 and the description herein is limited to the overall system.

In FIG. 1, a wafer or other work piece 2 to be exposed by an electron beam is positioned on the motor-driven table 24. The table 24 is located within the work chamber 80 of an electron beam column 76. The column 76 is a conventional device including an electron source 77, a blanking unit 78, a deflection unit 79, a work chamber 80, and an interferometer unit 81. The column 76 is typically like that manufactured by ETEC Corporation of Hayward, Calif.

The electron source 77 provides the electrons which are incident upon the work piece 2 on the table 24. Blanking unit 78 permits the electron beam to be focused on the work piece or blanks the electron beam to inhibit electrons in a conventional manner. The blanking unit 78 is selectively controlled to inhibit or pass the electron beam by the beam blanking control line 52 from the line generator 28.

The deflection unit 79 includes both X and y deflection coils (not shown) for positioning the electron beam in the X and Y axes. The X coil is driven by the output from the X sum circuit 36. Similarly the Y coil is driven by the Y sum circuit 36'.

The sum circuits 36 and 36' provide the X and Y drive signals to the deflection unit by summing a number of input signals. First, the sum circuits 36 and 36' receive the IX and IY commanded position signals as inputs from converters 32 and 32', respectively, which in turn are commanded by the line generator 28 and processor 26. The IX and IY signals specify the location of the electron beam with respect to a unit size in some predetermined coordinate system. In one embodiment, the unit size is $0.5 \times 10^{-6}$ meter.

The sum circuits 36 and 36' also receive correction signals IDX and IDY, respectively, which correct the position of the electron beam with some correction unit size as a function of the measured position of the moveable work piece 2 as measured by an interferometer unit 81. In one embodiment, the size of the correction signal is in units of $0.08 \times 10^{-6}$ meter. Accordingly, one unit of the IX position command signal ($0.5 \times 10^{-6}$ meter) summed with one unit of the IDX correction signal ($0.08 \times 10^{-6}$ meter) specifies a deflected distance of $0.58 \times 10^{-6}$ meter. Similarly, ten units of IX ($5.0 \times 10^{-6}$ meter) and 20 units of IDX ($1.6 \times 10^{-6}$ meter) specifies a deflected distance of $6.6 \times 10^{-6}$ meter.

The sum circuits 36 and 36' also receive rotation signals IRX and IRY, respectively, from units 131 and 131' for rotating the XY electron beam axes relative to the X'Y' axes of table 24. In FIG. 1, the work table 24 is driven in the X-axis direction by the X axis motor 20 and in the Y-axis direction by the Y axis motor 20'' to precisely position the work piece 2 relative to the incident electron beam. The actual position of the work piece 2 and the table 24 is measured by the interferometer unit 81. Typically the interferometer unit 81 includes an interferometer for measuring the X axis position which provides an X position output 22. Similarly, the interferometer unit 81 includes a Y axis unit providing a Y position output 22'. One typical interferometer unit is manufactured by Hewlett Packard Corporation and is model number HP5501. Such a unit provides a 24-bit output which is capable of measuring the actual position of the work piece 2 and table 24 to approximately $0.08 \times 10^{-6}$ meter. The interferometer unit is capable of tracking movements at rates of approximately up to 15 centimeters per second. The X and Y position outputs 22 and 22' from the interferometer unit 81 are connected as inputs to the X and Y axis table controls 10 and 10' respectively. Controls 10 and 10' provide signals to the units 34 and 34' to generate the correction signals IDX and IDY, respectively. In FIG. 1, the control circuitry for controlling the electron beam column 76 includes a computer 4 which commands the operation of the system in the exposure of the work piece 2 by the electron beam. Computer 4 in one typical embodiment is a Hewlett Packard model HP21MX. Computer 4 connects over a conventional digital interface 5 to the data bus 6. The computer 4 is also connected in a conventional way to I/O devices such as a CRT console 69, a magnetic tape unit 70 and a magnetic disc unit 71. The computer 4 controls the remainder of the system.

The computer 4, through the digital interface 5, communicates with a number of addressable units connected to bus 6. Bus 6 is typically a 16-bit bus with appropriate conventional selection means (not shown) for selecting an addressed one of the units connected to bus 6.

In FIG. 1, the units connected to bus 6 include the memory 7, the X gain control 8, the Y gain control 8', the X rotation control 11, the Y rotation control 11', the X table control 10 and the Y table control 10'.

Memory 7 is a random access memory typically storing 2,048 or more 16-bit words. The X and Y gain controls 8 and 8' are typically digital-to-analog converters (DAC). When selected by the digital interface 5, the controls 8 an 8' convert the digital outputs to analog levels on lines 9 and 9', respectively. Lines 9 and 9' each connect as a reference (R) input to the X and Y deflection DAC's 32 and 32'. The DAC's 8 and 8' and the DAC's 11 and 11' are conventional devices of the type which typically receive a 10-bit input to responsively provide one of 1024 levels for the analog signal output. Such devices are conventional and in one typical embodiment are manufactured by Burr Brown with model number 60-10. Since those DAC devices do not have means for storing the digital signals from bus 6, each of the DAC's 8, 8', 11 and 11' are shown in FIG. 1 to include conventional registers 8-1, 8'-1, 11-1, and 11'-1 for storing the digital data, respectively, under command of the interface 5.

When exposing the work piece 2 to form a pattern thereon, it is important that the deflection gain of the electron beam be accurately controlled so that the actual size of the electron beam scan field on the work piece 2 corresponds to the desired size of the electron beam scan field. The gain controls 8 and 8' are utilized for controlling the size of the electron beam scan field. When the beam deflection exceeds or is less than required for the desired scan field size, the deflection gain signals from controls 8 and 8' are controlled to appropriately adjust the respective referenced inputs to the converters 32 and 32'.

The X and Y rotation controls 11 and 11' are digital-to-analog converters (DAC) of the same type as the converters for controls 8 and 8'. The controls 11 and 11' convert digital outputs from the computer 4 into an analog level on lines 13 and 13', respectively. Lines 13 and 13' are each connected to one of the inputs of the multiplying amplifiers 131 and 131', respectively. The other input to amplifier 131 is supplied from the output of the Y converter 32'. Similarly, the other input to the amplifier 131' is supplied from the output of the X converter 32. The amplifiers 131 and 131', respectively, provide output signals which are connected in common with and summed with the outputs of the X and Y deflection converters 32 and 32', respectively, in the sum circuits, 36 and 36', respectively.

In FIG. 1, it is desired that the scanning axes, X and Y, of the electron beam coincide with the axes X' and Y' of the table 24, and with the axes, X'' and Y''', of the work piece 2. The three sets of axes XY, X'Y' and X''Y'' are shown with a common origin in FIG. 1. In order to bring the axes into common alignment, rotation of the electron beam axes XY is useful. The rotation controls 11 and 11' are utilized for adjustably rotating the axes XY of the electron beam relative to the axes X'Y' of the table and the axes X''Y'' the work piece 2. In operation, digital signals specifying the degree of rotation are supplied from the computer 4 to the inputs of the rotation controls 11 and 11'. The outputs from control 11 and 11' in turn control the rotation by controlling the electron beam deflection through operation of the sum circuits 36 and 36' and the amplifiers 131 and 131'.

The rotation controls 11 and 11' are also utilized for controlling the perpendicularity of the electron beam scanning in response to the digital outputs from the computer 4. Perpendicularity of the electron beam scanning refers to the X axis movement relative to the Y axis movement.

In FIG. 1, the X and Y table controls 10 and 10' receive data from and connect data to the 16-bit bus 6. Controls 10 and 10' are shown in further detail in FIG. 2. Briefly, the control 10 receives a commanded position from the bus 6. The commanded position from bus 6 is converted to the drive signal on line 16 for driving the X motor drive 18. The X motor drive 18 in turn drives the X motor 20 to position the X axis of the table 24 within the chamber 80. Similarly, the Y table control 10' via line 16' energizes the Y motor drive 18' which in turn energizes the Y motor 20'. The Y motor 20' drives the table 24 to the desired Y axis position. The motor drive 18 and 18' and the motors 20 and 20' are conventional devices for indexing a motor-driven table. A typical motor drive and motor employed in one preferred embodiment of the invention is manufactured by Torque Systems Inc. having model number RL 3260E. Such a system has a capacity of driving the table 24 at a rate of approximately 5 centimeters per second, and accelerating or decelerating at a rate of 10 meters/sec$^2$ (approximately 1G).

In addition to commanding the actual position of the table 24, the table control 10 and 10' also compare the commanded position (received over bus 6) with the actual position measured by the interferometer unit 81. The difference between the commanded position and the actual position is utilized to generate a correction signal on the 10-bit buses 14 and 14' for the controls 10 and 10', respectively. The 10-bit correction buses 14 and 14' are connected as inputs to the X and Y position correction DAC's 34 and 34'. The table 24 can be positioned by the motor drives 18 and 18' within an accuracy of about 0.24 micron from the commanded position. In order to provide higher accuracy as is necessary for scanning small areas, the converters 34 and 34' are utilized. The converters 34 and 34' form the analog correction signals IDX and IDY. The correction signals IDX and IDY are summed with the line scan signals IX and IY, respectively, in the sum circuits 36 and 36'. The line scan signals IX and IY are generated by the X and the Y deflection digital-to-analog converters (DAC) 32 and 32', respectively.

The converters 32 and 32' are of the same type as the converter 8 and 8'. Converters 32 and 32' are driven by inputs from the line generator 28 which is in turn driven by the line processor 26.

The line processor 26 is typically a conventional microprocessor such as the Motorola 6800. The line processor 26 accesses data for a line scan from the memory 7. Processor 25 then loads the line generator 28 with data sufficient for one line scan. The line generator 28 then is clocked at a high data rate loading the appropriate values into the converters 32 and 32' to perform a line scan at a high data rate. Converters 32 and 32' generate the line drive signals IX and IY in response to the outputs from line generator 28 as adjusted by the reference levels output from the gain controls 8 and 8'. Any correction factors required for drive signals IX and IY are derived from the converters 34 and 34' and the controls 11 and 11' which are all summed in the sum circuits 36 and 36'. The sum circuits 36 and 36' in turn drive the deflection unit 79 to actually position the electron beam.

The line generator 28 receives data from the line processor 26 via the 16-bit bus 57. Generator 28 in turn generates 10-bit deflection commands on output buses 53 and 53' which are connected to the X converter 32 and to the Y converter 32', respectively. Generator 28 also provides an output signal on line 52 which controls the blanking unit 78.

Line generator 28 provides a zero detect output line 51 which connects to the line processor 26. Zero detect line 51 signals the line processor 26 to indicate when the line generator 28 has completed a line scan. When generator 28 has completed a line scan, processor 26 immediately loads the generator 28 with a new line command and scanning continues in this manner.

The line generator 28 functions to inhibit line scanning whenever a STOP SCAN signal is drived on the lines 12 or 12' from the X and Y table controls 10 and 10'. The STOP SCAN signals signify that the commanded position of the table 24 relative to the actual position of table 24 exceeds a predetermined error (for example, greater than correctable by the 10-bit correction signal). Whenever this predetermined error is exceeded, the STOP SCAN signal functions to inhibit further operation of the line generator until the error is reduced to within the acceptable limits.

Wafer Holder and Alignment Device

A wafer holder and alignment device useful in practicing the present invention is disclosed in U.S. Pat. No. 4,189,230. FIG. 2 is a plan view of the wafer holder which includes a metallic frame 100 having a notch 102 which mates with a post on the XY table for alignment purposes. Two additional posts (not shown) function to serve as mechanical stops for another edge of the holder 100. Frame 100 has a circular opening 104 extending there-through with a flange 106 mounted on the top surface of frame 100 and overlapping the opening 104. A semiconductor wafer, for example, is mounted on frame 100 from the bottom side in opening 104 and abutting flange 106. The wafer is maintained within opening 104 by means of a spring loaded plunger and leaf spring (not shown) which are described in detail in U.S. Pat. No. 4,189,230.

An alignment device 108 is provided in the frame 100 in a position removed from the wafer for purposes of electron beam alignment. Preferably, alignment device 108 is a semiconductor chip in which an accurate alignment pattern has been formed on one surface by means of chemical etching, for example. FIG. 3 is a plan view of one pattern which may be formed on the surface of the alignment device for use in aligning an electron beam. By so positioning the alignment configuration in an area removed from the work piece, the V grooved pattern defined on the alignment surface is not susceptible to deleterious substances such as photoresist, oxides, etchants and the like. The alignment configuration includes a square 110 with four cross marks 112 etched in the corners of the square. The spacing between the centers of adjacent cross marks is exactly 500 microns. Four rectangular marks 114 and a center cross 116 are provided on the surface of the semiconductor chip within square 110 as aids to locate the alignment marks 112 during beam alignment. The surface of the semiconductor chip is covered with silicon dioxide except for the V groove etched pattern. It is known that electron emissivity of silicon dioxide is much higher than that of silicon. Thus, an electron microscope can easily detect the V grooved pattern on the surface of the semiconductor chip.

Beam Adjustment

In adjusting the electron beam a secondary electron emission detector is placed over the work piece and is connected to a scanning electron microscope. The detector detects electrons from the electron beam which are formed by the secondary emission of the surface of the alignment chip. Thus, as the electron beam scans across the alignment chip surface, the electron beam microscope displays an image of the surface in response to the secondary emission of electrons from the alignment chip.

FIG. 4 is a screen pattern of the display tube of the electron microscope which illustrates a magnification error of the electron beam. The screen is partitioned in four segments 121-124 with each segment displaying a corresponding alignment mark 112 from the pattern of FIG. 3. When the electron beam is correctly aligned, the patterns 112 will be aligned along the axes of each segment 121-124. As illustrated in FIG. 4, the amplification of the electrom beam is too large and the patterns 112 lie outside of the axes of the respective segments 121-124. Thus, the gain control 8 and 8' in FIG. 1 would be adjusted to bring the patterns 112 into alignment with the axes of the segments 121-124.

FIG. 5 is a screen pattern wherein the marks 112 are rotated out of alignment with the axes of the segments 121-124. To bring the marks 112 into alignment the electron beam is rotated in a counter-clockwise rotation. This is accomplished by adjusting the X rotate control 11 and Y rotate control 11' of FIG. 1.

After making the above adjustments, the electron beam exposure system is capable of scanning the electron beam at least in the area of a 500 micron square with high accuracy. In normal operation, the beam deflection will not have to be readjusted during exposure of a wafer. When a new wafer is placed in the system minor adjustments may be required to compensate for system drift. However, if different resist materials requiring different electron beam intensity for exposure are employed in the several manufacturing process, the beam deflection will require major adjustments.

System Alignment

After adjustment of the electron beam, alignment of the XY axes of the beam to the X-Y axes of the work piece, and alignment of the X-Y axes of the work piece to the X-Y axes of the moveable table is performed. Referring to FIG. 6, wafer 150 having axes indicated as X'-Y' is mounted on table 152 having axes designated X''-Y''. The electron beam axes are designated X-Y.

The work piece 150 is typically a semiconductor wafer of approximately 75 millimeters in diameter. The wafer 150 has a center indicated by the intersection of the X' and Y' axes. The X' and Y' axes are defined by cross marks 154 and 156 etched in the periphery of the wafer surface. These marks correspond to known positions on the wafer, and the marks will be used in aligning the beam to the wafer and the wafer to the table, as will be described herein below. Two additional cross marks, one for each axis, can be employed for improved alignment accuracy, if desired. The electron beam from electron beam column 76 of FIG. 1 is incident upon the wafer 150 at a location indicated by the intersection of the X and Y axes. The table 152 and wafer 150 are relatively moveable with respect to the incident electron beam. Therefore, the X' and Y' axes are relatively moveable with respect to the XY axes through movement of the table 152. The point of incidence (intersection of X and Y) of the electron beam is shown in the lower left quadrant of the X' and Y' axes, and the area of incidence of the electron beam is at one row and one column address within a scan field of the beam. That scan field is in turn within one of many chip areas. The particular chip area 151-1 over which the scan field of the electron beam is incident is determined by the position of the table 24 as defined by wafer axes X' and Y'. The chip areas 151 are areas which can be ultimately diced and then packaged to form individual integrated circuits. A chip area can be and typically is larger than the scan field of the electron beam. Therefore, each chip area is divided into partitions which can be individually exposed by the beam scan field. The table 152 and wafer 150 are moved to superimpose the beam scan field over a selected chip area and over a selected partition within a chip area.

The electron beam axes X and Y are located to position the electron beam scan field over a chip area 151-1. The scale of FIG. 6 does not allow the partitions of the chip area 151-1 to be observed.

In one application as described in co-pending application Ser. No. 847,485, supra, now U.S. Pat. No. 4,147,937 the beam scan field is typically 512 by 512 microns and the chip area 151, is typically 1350 by 1606 microns. Since the scan field is smaller than the chip area 151, the chip area 151 is divided into twelve partitions with each partition smaller than the scan field. Each partition is positioned, at a different time, to be superimposed by the electron beam scan field so that twelve different positions of the table 24 and wafer 2 are needed to permit one chip area 105 to be fully scanned by the electron beam.

As shown in FIG. 6, the electron beam scan field is positioned over the chip area 151-1. Wafer 150 will accommodate hundreds of other chip areas of the same size, some of which are represented by chip areas 151 in FIG. 6. The table 152 is positionable to locate any chip area 151 (and any partition of a chip area) beneath the electron beam scan field.

Prior to beginning the adjustment of the electron beam, the interferometer reading is adjusted by driving the XY table to an end position for establishing the 0.0 coordinate of the XY table. This is accomplished in accordance with the table positioning system described U.S. Pat. No. 4,191,916.

After establishing the XY values for the table, the table is moved to bring the wafer 150 into registration with the electron beam. More specifically, the beam is focused on either mark 154 or 156 of the wafer 150, and the field of the electron beam is rotated to bring the XY coordinates of the beam into parallel alignment with the X', Y' coordinates of the wafer. Offset between the beam XY coordinate and the wafer X'Y' coordinates is established by moving the table and wafer whereby the beam at a known coordinate (e.g. 0.0) is focused on mark 154 or 156 of the wafer which has known coordinates in the X'Y' axes. Thus, the wafer coordinates are related to the beam coordinates in accordance with the following equations:

$$X' = X + E$$

$$Y' = Y + F$$

where E and F are the offsets in the wafer position along the X axis and Y axis, respectively, between the electron beam coordinates and the known wafer location.

With the wafer coordinates now related to the electron beam coordinates, after rotating the field of the electron beam whereby the X and Y coordinates of the beam are parallel to the X' and Y' coordinates of the wafer, the wafer coordinates are now established relative to the table axes. As noted in FIG. 6, the X'Y' axes of the wafer are not necessarily parallel to the X" Y" axes of the table. No attempt is made to physically rotate the wafer to align its axes with the table, as was done with the electron beam in aligning with the wafer. Rather, the two known positions 154 and 156 on the wafer, as defined on the X'Y' coordinates, are located on the corresponding X" Y" axes of the table. The relationship of the coordinates can be expressed by the following two equations:

$$X' = AX'' - BY'' + C$$

$$Y' = BX'' + AY'' + D$$

Thus, by locating the corresponding table coordinates for the wafer coordinates of points 154 and 156, four equations can be generated from which the four unknowns (A, B, C, and D) can be determined.

Having now established the relationship of the wafer coordinates to the table coordinates, and the electron beam coordinates to the wafer coordinates, partitions on the wafer surface can be moved into alignment with the electron beam by movement of the XY table on which the wafer is mounted. Computer controlled movement of the electron beam for any partition can be repeated by repositioning the table and wafer so that other partitions are located under the electron beam. Accordingly, the electron beam can be made to repetitiously sweep all chip areas and surface partitions within each chip area, with the electron beam under computer control, by the repositioning of the table in accordance with the defined coordinate relationships.

After the entire wafer surface has been exposed to the electron beam in developing a resist pattern, the wafer will be removed from the XY table and the electron beam apparatus for other processing such as chemical etching and vapor deposition. The wafer will be returned to the apparatus for subsequent resist mask definition, and each time the wafer is returned to the apparatus a new alignment procedure must be undertaken to align the beam to the wafer and XY table.

In one embodiment the electron beam has a diameter of 0.5 micron, and 2 microns width lines can be defined on a wafer using an XY table with positioning accuracy of 0.08 micron accuracy.

While the invention has been described with reference to a specific embodiment, the description is illustrative and is not to be construed as limiting the scope of the invention. Various modifications, applications, and changes may occur to those skilled in the art without departing from the true spirit and scope of the invention as defined by the appended claims.

What is claimed is:

1. In an electron beam exposure apparatus including an electron source, beam deflection means, a work chamber, an X-Y table within said work chamber, and a work piece holder including alignment device mounted on said table, a method of aligning said electron beam and exposing a work piece to said electron beam comprising the steps of
    (a) moving said table and said work piece to focus said electron beam on a fixed alignment mark on said work piece,
    (b) aligning said electron beam to said fixed alignment mark on said work piece by adjusting gain and rotation of said electron beam to conform to the coordinates of said work piece,
    (c) determining the coordinates of said table relative to the coordinates of said work piece mounted in said holder on said table by noting the coordinates of at least two known positions on said work piece on the axes of said table, and
    (d) moving said table whereby a plurality of partitions of said work piece are exposed to said electron beam.

2. The method defined by claim 1 wherein the electron beam positions (X,Y) are correlated to the work piece positions (X'Y') in accordance with the equations $$X = X' + E$$

$$Y = Y' + F$$

where the constants E and F are determined by positioning said electron beam on said fixed alignment mark.

3. The method defined by claim 2 wherein step "(b)" includes moving said table to table positions (X"Y") corresponding to said at least two work piece positions (X', Y') in accordance with the equations $$X'' = AX' - BY' + C$$

$$Y'' = BX' + AY' + D$$

where the constants A, B, C, and D are determined from said at least two work piece positions and corresponding table positions.

4. The method defined by claim 3 wherein step (a) is preceded by the step of adjusting said electron beam by positioning said electron beam on fixed marks on said alignment device.

5. The method as defined by claim 1 wherein said method exposes a coating of resist material on the surface of a semiconductor wafer work piece.

6. The method defined by claim 1 wherein step (a) includes the step of adjusting said electron beam by positioning said electron beam on fixed marks on said alignment device.

* * * * *